United States Patent
Wydeven

(10) Patent No.: US 6,555,835 B1
(45) Date of Patent: Apr. 29, 2003

(54) ULTRAVIOLET-OZONE OXIDATION SYSTEM AND METHOD

(75) Inventor: Theodore J. Wydeven, Sunnyvale, CA (US)

(73) Assignee: Samco International, Inc. (JP)

( * ) Notice: Subject to any disclaimer, the term of this patent is extended or adjusted under 35 U.S.C. 154(b) by 0 days.

(21) Appl. No.: 09/370,476

(22) Filed: Aug. 9, 1999

(51) Int. Cl.$^7$ ............................................. B08B 7/00
(52) U.S. Cl. ...................... 250/504 R; 250/205; 134/1; 134/19; 134/201; 134/1.3
(58) Field of Search .................. 250/504 R, 205; 134/1, 19, 201, 58 R, 56 R

(56) References Cited

U.S. PATENT DOCUMENTS

| | | |
|---|---|---|
| 3,833,814 A | 9/1974 | Nablo |
| 3,921,788 A | 11/1975 | Robertson, Jr. et al. |
| 4,300,272 A | 11/1981 | Hafner et al. |
| 4,775,789 A | 10/1988 | Albridge, Jr. et al. |
| 5,001,352 A | 3/1991 | Tetzlaff |
| 5,004,924 A | 4/1991 | Imahashi |
| 5,023,187 A | 6/1991 | Koebler et al. |
| 5,083,030 A | 1/1992 | Stavov |
| 5,164,599 A | 11/1992 | Benveniste |
| 5,171,525 A | 12/1992 | Jacob |
| 5,432,345 A | 7/1995 | Kelly |
| 5,814,156 A * | 9/1998 | Elliot et al. .................. 134/1 |
| 6,254,689 B1 * | 7/2001 | Meder ........................... 134/1 |

OTHER PUBLICATIONS

"Ultraviolet–Ozone Cleaning of Semiconductor Surfaces", John. R. Vig, ADA 256, 158 of Army Res. Lab., NJ.*
UVOCS, Inc., "Ultra–Violet Ozone Cleaning Systems," *Product Brochure*, Mar. 4, 1999.
"Ultra–Violet Ozone Cleaning of Semiconductor Surfaces," *U.S. Department of Commerce, NTIS*, ADA 256 158 Oct. 1992.
H. Bader and J. Hoigne, "Determination of Ozone in Water by the Indigo Method," _Research_, vol. 15, pp. 449 to 456, 1981.
Jack C. Korman, "A Progress Report on Manufacturing Methods and Technology for Production of High–Stability, Vibration–Resistant Quartz Crystal Units," *Proc. Annu. Freq. Control Symp.*, 1985, 39th: 338–341.
R.J. Ney and E. Hafner, "Continuous Vacuum Processing System for Quartz Crystal Resonators," *Proc. Annu. Freq. Control Symp*, 1979, 33rd: 368–373.

(List continued on next page.)

*Primary Examiner*—Bruce Anderson
*Assistant Examiner*—Zia R. Hashmi
(74) *Attorney, Agent, or Firm*—Burns, Doane, Swecker & Mathis, LLP

(57) ABSTRACT

An ultraviolet ozone oxidation system combines ultraviolet radiation, ozone, and heat to gently and effectively remove organic materials from a variety of substrates. The UV-ozone oxidation system includes a source of ozone which flows into a reaction chamber of the ultraviolet ozone oxidation system. The reaction chamber includes a UV lamp positioned above a heated sample stage. The heated sample stage is movably mounted such that a distance between the work piece or sample and the UV lamp can be adjusted to a minimum possible distance to improve process time. In addition, the heated sample stage is provided with a radiant heater which will provide adequate heating of the sample stage while the distance between the heater and the sample stage may be varied. The reaction chamber is also provided with a membrane diffuser which is positioned between the ozone source and the sample stage for uniformly distributing ozone to the sample on the sample stage.

17 Claims, 7 Drawing Sheets

OTHER PUBLICATIONS

Jelight Company, Inc., "UVO–Cleaner," *Product Brochure*.

Bioxide Corporation, "Company Information," "Water Treatment Information," "Air Treatment Technologies," "Deligen II Test Data (AIR)," *Product Brochures*.

Samco International, Inc., "Precise Reactive Ion Etching Systems," "Versatile Plasma Enhanced Chemical Vapor Deposition Systems," "Reliable UV Ozone Stripper/Cleaner Systems," *Product Brochure*.

Samco, "UV– Ozone Stripper/Cleaner—UV—300H," *Product Brochure*.

Samco, "UV– Ozone Stripper/Cleaner—UV –1," *Product Brochure*.

ESC International, "Automated UV/Ozone Cleaning Machine," *Product Brochure*.

ESC International, "UV/Ozone Processing System," *Product Brochure*.

Wydeven, T., et al., "An Improved UV/Ozone Oxidation System", *Ozone Science & Engineering*, vol. 22, pp. 427–440 (2000).

* cited by examiner

ULTRAVIOLET-OZONE OXIDATION SYSTEM AND METHOD

BACKGROUND OF THE INVENTION

1. Field of the Invention

The invention relates to an ultraviolet-ozone oxidation system and method, and more particularly, the invention relates to a cleaning-stripping apparatus using a combination of ultraviolet radiation and ozone.

2. Brief Description of the Related Art

Ultraviolet-ozone cleaning-stripping systems have been used as an effective method to remove a variety of contaminants from the surfaces of semi-conductors as well as many other surfaces. Ultraviolet-ozone cleaning is a simple to use and inexpensive process for removing contaminants from semi-conductors. One of the uses of ultraviolet-ozone cleaning is to strip away organic layers, such as photo resist layers, or other organic contamination from a semiconductor work piece during the manufacture of silicon-based electronic devices.

It is generally thought that the combination of ultraviolet (UV) light and ozone destroys organic compounds by photosensitized oxidation. The organic molecules are excited, dissociated, or depolymerized by short-wavelength UV light, such as the light emitted by a low-pressure mercury lamp in a quartz envelope. These excited molecules are particularly likely to undergo oxidation by atomic oxygen, ozone, or other minor oxidants. One primary reaction thought to occur when ozone and oxygen molecules are exposed to UV radiation from the mercury lamp is the conversion of oxygen to ozone. At elevated temperatures, a second reaction occurs in which ozone thermally decomposes in the gas phase forming atomic and molecular oxygen.

An auxiliary ozone generator is often added to a UV-ozone cleaning system to further increase the concentration of oxidants and thereby shorten the process time. It has also been shown that an elevated temperature in the UV-ozone oxidation system accelerates the rate of oxidation of organic matter. For example, with an ozone/oxygen flow rate of 0.5 liters per minute and an ozone concentration of 6.4 grams per cubic meter, the rate of oxidation of a photo resist at 150° C. was only 54 Angstroms per minute, while at 300° C. the rate of oxidation increased to 596 Angstroms per minute, i.e., ten times faster.

The UV-ozone oxidation equipment used to carry out stripping and cleaning generally includes a base or sample stage upon which a work piece is placed inside a reaction chamber. The reaction chamber is provided with a source of ultraviolet light focused on the work piece and an ozone source capable of delivering a mixture of ozone and oxygen to the reaction chamber over the work piece. However, current UV-ozone oxidation systems lack uniformity of oxidation across the entire surface of the work piece and lack versatility for use with work pieces of different sizes.

The known UV-ozone oxidation systems employ a showerhead type gas diffuser consisting of several small diameter stainless steel tubes attached to a gas inlet manifold which deliver the ozone to the work piece. However, this showerhead type gas diffuser delivers a relatively non-uniform ozone/oxygen flow over the surface of the work piece. Accordingly, the stripping or cleaning process using known UV-ozone systems may not be sufficiently uniform for certain applications where uniform oxidation is critical.

In addition, known UV-ozone oxidation systems employ resistance heaters beneath the sample stage to heat the work piece which is positioned on the sample stage. However, these resistance heaters take a substantial amount of time for heat up and cool down, unnecessarily extending the time required for the stripping or cleaning process.

In addition, in order to achieve a shorter overall process time, it is desirable to have the UV lamp positioned as closely as possible to the work piece on the sample stage. However, because work pieces vary in thickness, sufficient space must be provided in the reaction chamber between the sample stage and the UV lamp to accommodate relatively large work pieces.

Accordingly, it would be desirable to provide an UV-ozone oxidation system with a shortened overall process time and improved uniformity of cleaning or stripping.

SUMMARY OF THE INVENTION

The present invention relates to a ultraviolet-ozone oxidation system with an improved uniformity in the delivery of ozone over a work piece to be cleaned or stripped. The present invention also relates to an improved ultraviolet-ozone oxidation system in which the overall process time required for cleaning or stripping a work piece is reduced.

In accordance with one aspect of the present invention, an ultraviolet-ozone oxidation system includes a reaction chamber, an ozone source for delivering ozone to the reaction chamber, a sample stage for supporting a sample in the reaction chamber, a source of ultraviolet light directed at the sample on the sample stage, and a membrane diffuser positioned between the ozone source and the sample stage for uniformly distributing ozone to the sample on the sample stage.

In accordance with an additional aspect of the present invention, an ultraviolet-ozone oxidation system includes a reaction chamber, an ozone source for delivering ozone to the reaction chamber, a source of ultraviolet light, and a movable sample stage for supporting a sample in the reaction chamber. The movable sample stage is movable with respect to the source of ultraviolet light to adjust a distance between the sample supported on the sample stage and the source of ultraviolet light.

BRIEF DESCRIPTION OF THE DRAWINGS

The invention will now be described in greater detail with reference to the preferred embodiments illustrated in the accompanying drawings, in which like elements bear like reference numerals, and wherein.

DETAILED DESCRIPTION OF THE PREFERRED EMBODIMENTS

Figure 1:
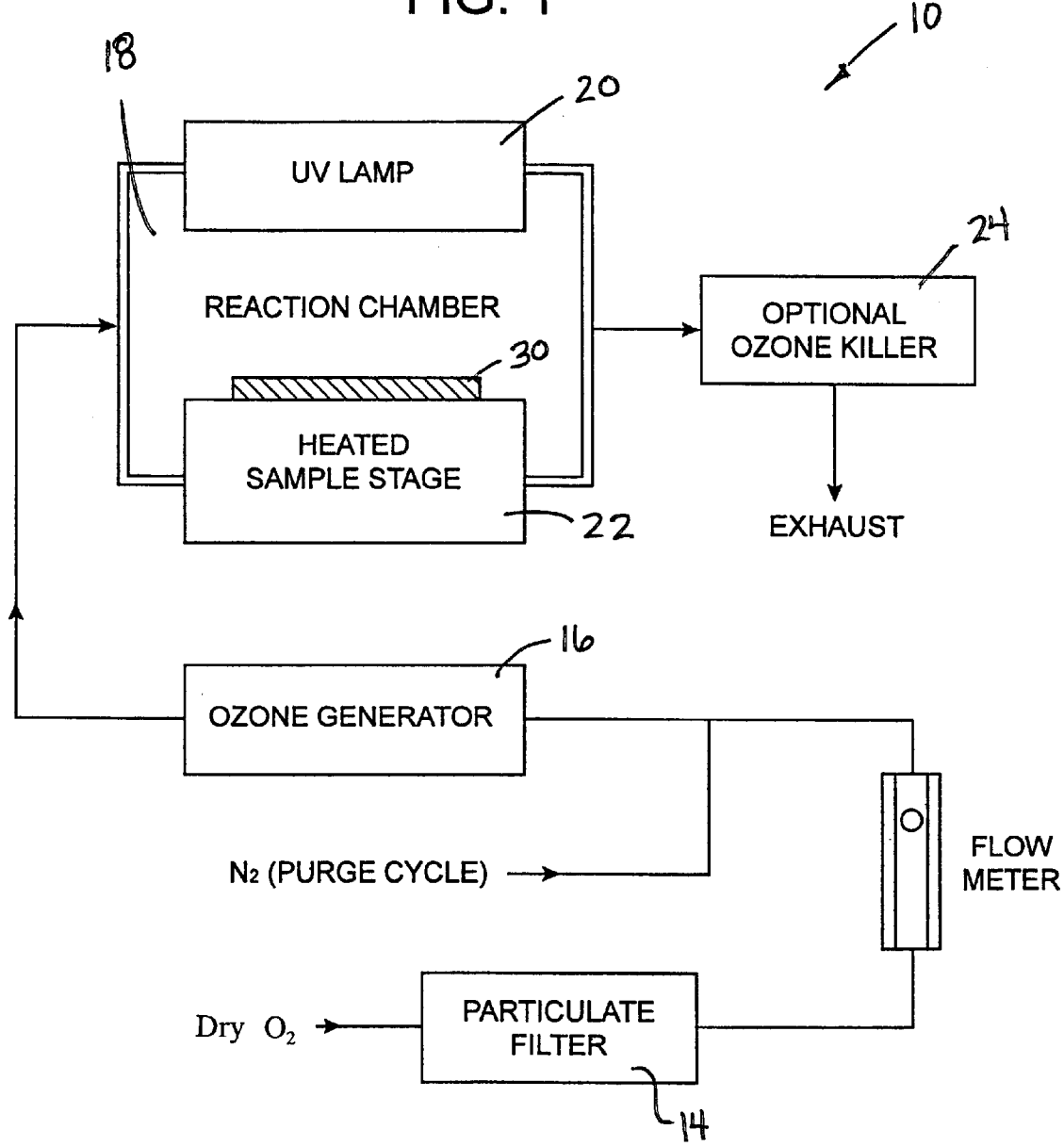
FIG. 1 is a schematic view of an ultraviolet-ozone oxidation system according to the present invention.

FIG. 1 illustrates an example of an ultraviolet ozone oxidation system which combines ultraviolet radiation, ozone, and heat to gently and effectively remove organic materials from a variety of substrates. The UV-ozone oxidation system 10 includes a source of ozone in this case which is provided by feeding dry oxygen through a particulate filter 14 and feeding the dry particulate free oxygen through an ozone generator 16. This ozone then flows into a reaction chamber 18 of the ultraviolet ozone oxidation system 10. The reaction chamber 18 includes a UV lamp 20 positioned above a heated sample stage 22. The exhaust from the reaction chamber 18 may be passed through an optional ozone killer 24 such an ozone decomposition catalyst unit where unreacted ozone is destroyed before entering the atmosphere.

As will be described in further detail below, the heated sample stage 22 is movably mounted to allow a distance between the work piece or sample 30 and the UV lamp 20 to be reduced to improve process time. In addition, the heated sample stage is provided with a radiant heater which provides adequate heating of the sample stage 22 while the distance between the heater and the sample stage may be varied. The radiant heater also provides faster heat up and cool down than conventional resistance heaters. The reaction chamber is also provided with a membrane diffuser 32, shown in FIG. 2, which is positioned between the ozone source and the sample stage 22 for uniformly distributing ozone to the sample 30 on the sample stage.

In use, ozone flows into the reaction chamber 18 and is uniformly distributed over the sample 30 by the membrane diffuser 32. The UV lamp 20 provides uniform UV radiation of the sample 30. Some of the ozone decomposes into oxygen molecules and atomic oxygen when exposed to the UV radiation and simultaneously, organic material such as photo resist, solvent residues, human skin oils, and pump oil are excited or disassociated by the short wavelength UV radiation. The atomic oxygen is highly reactive and oxidizes the excited organic molecules to form simpler, harmless products such as carbon dioxide and water. This process cleans or removes organic contaminates from the sample which are then exhausted from the reaction chamber 18.

Figure 2:
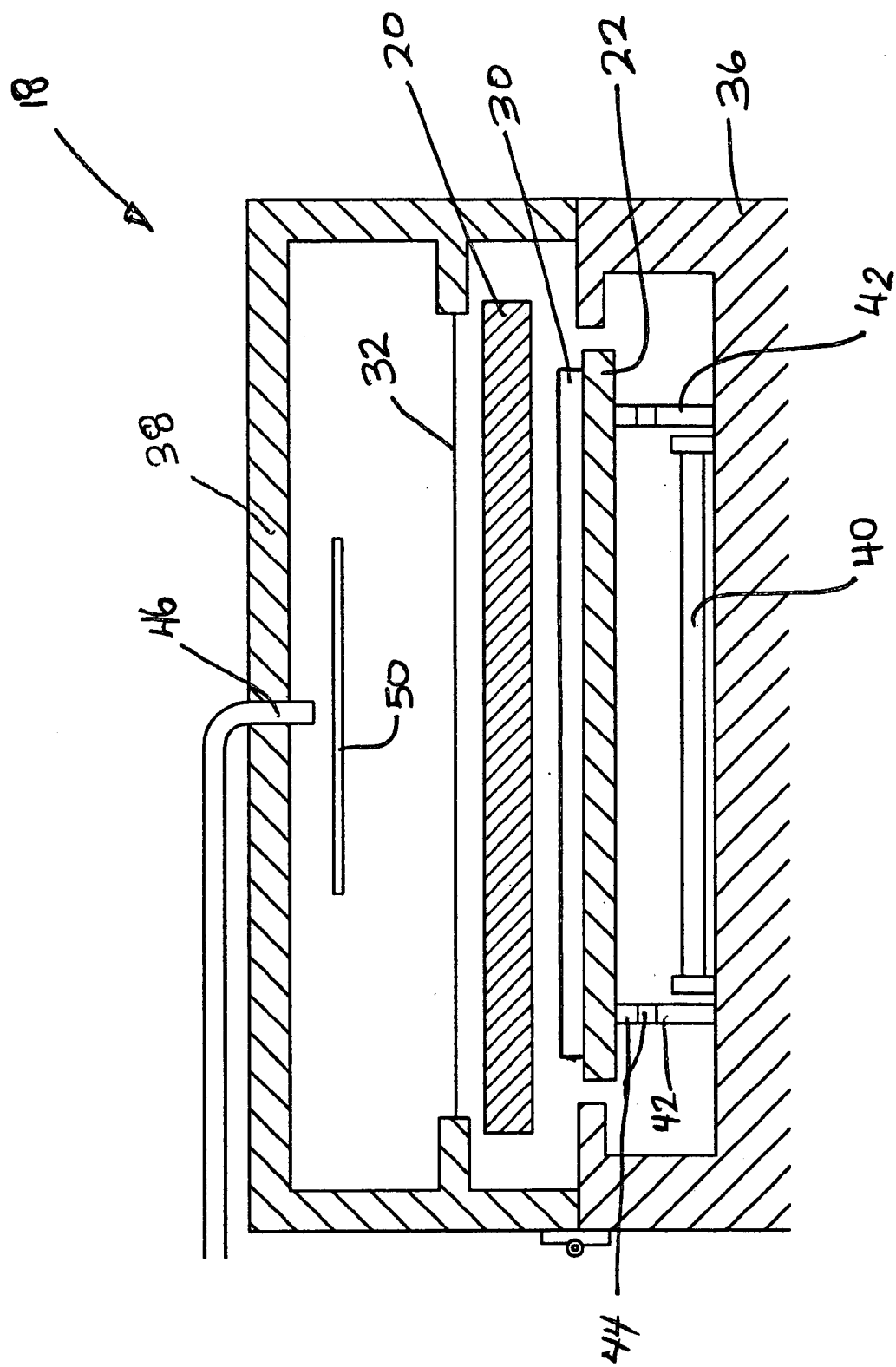
FIG. 2 is a schematic side cross sectional view of a reaction chamber for an ultraviolet-ozone oxidation system according to the present invention.

FIG. 2 shows a side cross sectional view of one example of a reaction chamber according to the present invention.

The reaction chamber 18 includes a base 36 and a cover 38 which may be lifted or removed to place a sample 30 on the sample stage 22. Positioned within the base 36 of the reaction chamber 18 is the movable sample stage 22 located above a radiant heater 40. A bottom of the sample stage 22 is provided with a surface which absorbs radiant heat from the radiant heater 40. For example, the sample stage 22 may be an anodized aluminum platform having a black bottom surface. The radiant heater 40 may be any of the known radiant heating elements which provide fast heat up times and energy efficiency such as quartz infrared heat lamps or metal ribbon radiant heaters, such as the heating elements commonly found in glass ceramic cook tops.

Preferably, a temperature of the sample stage 22 is controlled by a temperature controller connected with one or more thermocouples on the sample stage.

Figure 3:
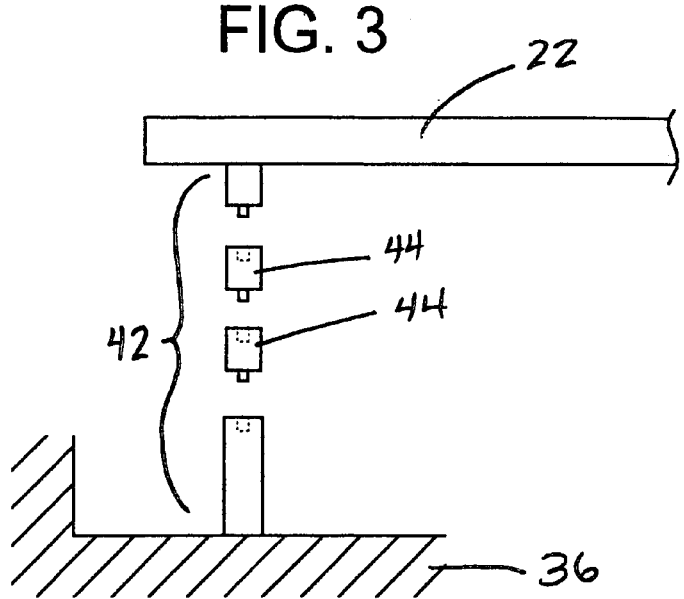
FIG. 3 is a schematic side view of a system of spacers for a movable sample stage according to the present invention.

As shown in FIG. 3, the sample stage 22 is supported in the base 36 of the reaction chamber 18 by a plurality of supports 42 spaced beneath the sample stage. Each of the supports 42 is provided with a plurality of spacers 44 which may be threaded or otherwise seated together to adjust the height of the sample stage 22. The spacers 44 allow a distance between the sample stage 22 and the UV lamp 20 to be adjusted depending on a thickness of the sample 30 which is positioned on the sample stage. The spacers 44 allow the sample to be positioned as closely as possible to the UV lamp 20 to improve the process time of the system. Preferably a distance between the UV lamp 20 and the surface of the sample is about 0.1 mm to about 5 mm, more preferably approximately 1 mm.

The membrane diffuser 32 as shown in FIG. 2, is positioned between a central ozone inlet 46 and the sample 30 positioned on the sample stage 22 of the reaction chamber. The membrane diffuser 32 may be formed of any membrane material that does not degrade when exposed to UV light and ozone. The membrane diffuser 32 has average pore sizes of about $0.01\mu$–$10\mu$, preferably about $0.1\mu$–$1\mu$. Examples of materials suitable for use as the membrane diffuser 32 include porous glass, polymer, ceramic, and the like. The membrane diffuser 32 also preferably filters out particulates which are present in the ozone supply.

One example of a suitable membrane diffuser material is a fluorinated polymer membrane (available from Pall Gelman Sciences). The membrane has a thickness of 91 $\mu$m and an average pore size of 0.2 $\mu$m. A permeability coefficient of the membrane for air was 410–440 sccm/cm$^2$ psi.

The membrane diffuser 32 may be positioned within the reaction chamber such that the membrane diffuser material rests on an aluminum mesh material to which the UV lamp 20 is attached. The membrane diffuser 22 uniformly distributes ozone and oxygen over the entire surface of the sample positioned on the sample stage 22.

A baffle 50, as shown in FIG. 2, may be provided within the reaction chamber 18 and spaced a short distance from the central ozone inlet 46. The baffle 50 distributes the ozone more evenly across the membrane diffuser 32. The baffle 50 may be solid or perforated and may be shaped and sized as necessary for a desirable ozone distribution.

The membrane diffuser 32 may also be used in a system in which ozone is not delivered to the reaction chamber 18 from the ozone source. In this system ozone is generated by the exposure of the gas within the reaction chamber to the UV light and the generated ozone is distributed evenly across the sample 30 by the membrane diffuser 32. Alternatively, the system may also be operated without the UV lamp 20 when ozone is delivered to the reaction chamber 18 from the ozone source and distributed by the membrane diffuser 32.

Figure 4:
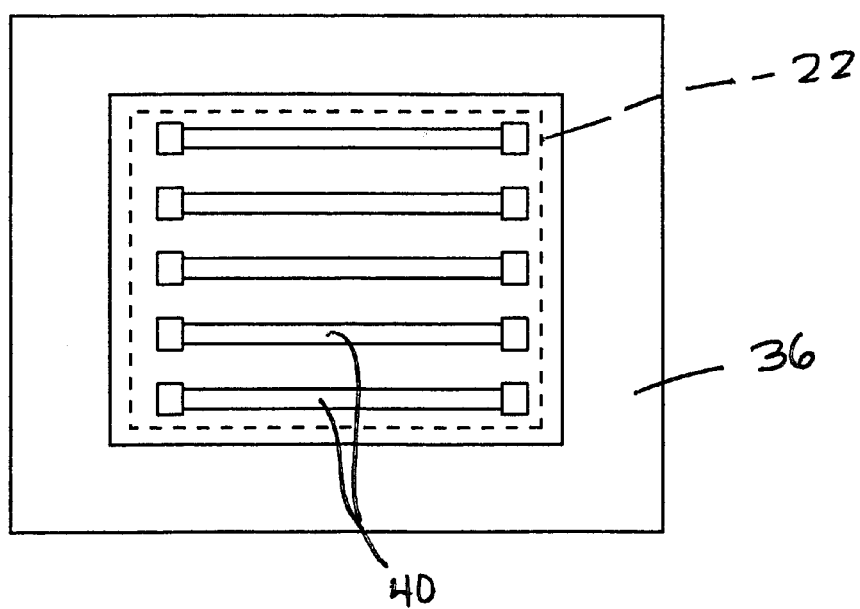
FIG. 4 is a top view of a lower portion of the reaction chamber of FIG. 2 showing an arrangement of radiant heat lamps for heating the sample stage.

FIG. 4 illustrates one example of an arrangement of radiant heaters 40 which are positioned beneath the sample stage 22. As shown in FIG. 4, the radiant heaters 40 may be provided by a plurality of infrared heat lamps, such as double ended tungsten halogen quartz infrared heat lamps, which are arranged in a square array to uniformly heat the sample stage 22. The heat lamps are preferably five 500 W lamps arranged in parallel and connected electrically in parallel to produce an array with a total energy output of about 2500 W across a sample stage with dimensions of approximately 17 cm by 17 cm.

The UV lamp 20 used in the reaction chamber 18 may be any known UV lamp such as a UV hot cathode spiral lamp or a UV cold cathode grid lamp. However, a cold cathode grid lamp, such as a low pressure mercury vapor grid lamp is preferred due to its improved uniformity of irradiance. The area of the grid lamp should be sufficient to fully illuminate the top surface of the sample stage 22. Preferably, the UV energy is provided at a short wavelength such as about 100 nm to about 400 nm.

EXAMPLES

Several modifications were made to a SAMCO UV-1 commercial UV-ozone stripper/cleaner for performance of the tests which are described below in Examples A–N. Heating of the sample stage was done with radiant heaters instead of a resistance heater. Quartz infrared heat lamps were used for heating the sample stage and dramatically shortened the heating-cooling cycle relative to a resistance heater; the lamps also heated the sample platform more uniformly. A cold cathode UV grid lamp provided more uniform illumination of the sample support stage than did the standard hot cathode spiral lamp. The UV grid lamp also reached steady-state power output sooner than the spiral lamp. A polymeric membrane was used as a membrane diffuser for ozone/oxygen mixtures and there was no apparent degradation of the membrane due to exposure to the UV/ozone. Furthermore, the membrane diffuser prevents particles larger than 0.2 $\mu$m (the average membrane pore size) from entering the reaction chamber.

MATERIALS: The following is a list of chemicals used in this work along with their source:

Ultra High Purity Oxygen gas (manufacturer's stated purity 99.993% and containing less than 3 PPM $H_2O$) was used without further purification; Praxair. Nitrogen gas from a refrigerated liquid nitrogen cylinder; Praxair. 5,5',7 Indigotrisulfonic Acid (potassium salt, manufacturer's stated dye concentration ~75%); SIGMA Chemical Co. OFPR-800 photoresist; Tokyo Ohka, Tokyo, Japan.

QUARTZ INFRARED HEAT LAMPS: Five Philips double-ended tungsten-halogen quartz infrared heat lamps (Philips product number 312074) were used to construct a square array ( ~14 cm×~14 cm) of lamps to heat the sample support stage in the modified SAMCO UV-1. The five 500 W lamps were arranged in parallel (and could easily be replaced for repairs) and connected electrically in parallel to produce an array with a total energy output of 2500 W. The size of the array was sufficient to completely illuminate the bottom of the square, black anodized aluminum sample platform. The dimensions of the sample platform were 6.75"×6.75"×0.125" (17.1 cm×17.1 cm×3.17 mm). The rear corners of the platform had a 0.625"×2.75" (1.59 cm×6.99 cm) segment cut from each corner in order to accommodate the electrodes from the grid lamp when the cover was closed.

METAL RIBBON RADIANT HEATER: A 1400 W Haliant™ element (metal ribbon) circular radiant heater was obtained from E.G.O. Products, Inc., Newman, Ga. The 120 Volts alternating current (VAC) circular heater had an overall diameter of 7.88" (20.0 cm) and fit conveniently into the standard SAMCO UV-1 reaction chamber. The Haliant™ elements are commonly found in modern glass-ceramic cooktops primarily because of their fast heat-up time and greater energy efficiency. The performance of the metal ribbon radiant heater was studied in air only and not installed in the modified UV-1.

TEMPERATURE CONTROLLER AND POWER SWITCH: A Watlow Series 96 digital temperature controller connected to a Watlow DIN-a-mite power switch was used to power the quartz infrared lamp heater and control the temperature of the sample support stage in the modified UV-1 and in the metal ribbon radiant heater experiment. The input for the controller was a Type K thermocouple. The junction of the thermocouple was embedded into a 0.56 mm (22 mil) diameter hole drilled into the edge of the aluminum support plates. The temperatures presented in the tables and figures in this application are those obtained from the embedded thermocouple unless otherwise stated.

UV GRID LAMP: A cold cathode low-pressure mercury vapor grid lamp with a Suprasil quartz envelope was purchased from Jelight Company, Inc. The grid dimensions were 6.5"×6.5" (16.5 cm×16.5 cm) and the diameter of the quartz tube used for constructing the grid was 6 mm. The area of the grid lamp was sufficient to fully illuminate the top surface of the sample support stage. A 30 milliamp (ma) current limited AC transformer powered the grid lamp while the transformer itself was powered by 120 VAC. During steady-state operation of the grid lamp the voltage to the lamp was approximately 1200 V. Near steady-state voltage was reached in less than one minute after the lamp was turned on. The grid lamp was attached to one surface of an aluminum mesh with dimensions: 7.25"×7.25"×0.0625" (18.4 cm×18.4 cm×0.16 cm); 33 openings/square inch with each circular opening having a diameter of 0.125" (3.2 mm). These mesh dimensions yielded a mesh open area of 41 percent.

MEMBRANE DIFFUSER: A quantity of unsupported yet robust fluorinated polymer membrane diffuser was obtained from Pall Gelman Sciences. The roll of membrane material was 10.25" (26.0 cm) wide, the membrane thickness was 3.6±0.5 mil (91 $\mu$m), the average pore size was 0.2 $\mu$m and the permeability coefficient for air was 410–440 sccm/cm$^2$ psi. The membrane diffuser rested on the opposing surface of the aluminum mesh to which the UV grid lamp was attached. The permeability of the membrane was 2 orders of magnitude greater than that needed to accommodate the gas flow rates used in this work and still work effectively as a gas diffuser, i.e., uniformly distribute ozone/oxygen over the sample support platform.

BRIEF DESCRIPTION OF THE UV/OZONE PROCESS: Dry, particulate-free oxygen is supplied to the inlet port of the SAMCO UV-1 system and flows (0.5 l/min for this work) into a silent discharge ozone generator where some of the oxygen is converted to ozone. The ozone/oxygen mixture then enters a stainless steel inlet manifold, flows through a gas diffuser (several small tubes in the case of the standard UV-1 and the permeable membrane diffuser in the case of the modified UV-1) and into the reaction chamber at atmospheric pressure. In the reaction chamber, the ozone/oxygen mixture flows over the samples that are continuously illuminated by short-wavelength UV radiation. The combination of UV light and ozone produces a strong oxidizing environment that destroys organic compounds or oxidizes surfaces. The gas mixture finally exits the reactor and subsequently flows through a catalyst bed where unreacted ozone is destroyed before entering the atmosphere. Upon completion of an oxidation experiment, the ozone/oxygen mixture and any other gases are purged from the system with dry nitrogen gas.

OTHER INSTRUMENTATION: An OmniTron™ Model 100 Thermocouple Thermometer was used for readout of the temperature from the Type K thermocouple attached to the surface of the silicon wafer. The UV irradiance at 254 nanometers (nm) was measured with an OAI Model 307 UV powermeter. Ozone concentration at the outlet of the silent discharge ozone generator and elsewhere was measured with an UV-absorption-based Anseros Model GM ozone analyzer. A Dektak$^3$ measuring system was used to measure the step height of stripped samples of photoresist. The step height was used to calculate the stripping rate. The Materials Analysis Group of Accurel Systems International made X-ray Photoelectron Spectroscopy (XPS) measurements with a Surface Science Instruments Model SX100-01 spectrometer using monochromatic Al K radiation (1486 electron volts (eV)].

Example A

Figure 5:
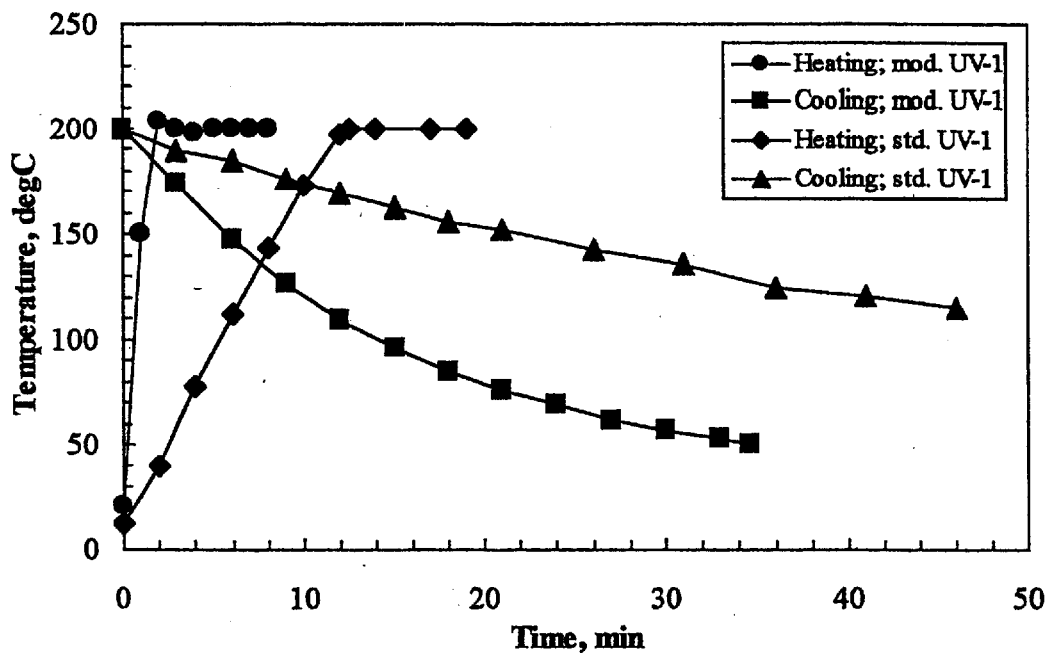
FIG. 5 is a graph of the heating and cooling curves for a sample stage heated with a resistance heater compared with a sample stage heated with the quartz infrared heat lamps according to the present invention.

FIG. 5 shows kinetic plots for heating and cooling of the sample support stage by a resistance heater in the standard SAMCO UV-1 system. In addition, FIG. 5 shows similar plots for the modified UV-1 heated by quartz infrared heat lamps, a radiant heat source. The bottom of the sample support platform was 4.9 cm from the top of the heat lamps. The time required to reach the setpoint temperature of 200° C. starting from ambient temperature in the standard UV-1 was approximately 13 minutes whereas in the modified system the time was only about 2 minutes, a factor of about 6 times shorter. The time required to cool in a flowing nitrogen stream (3 l/min) from 200° C. to 50° C. (warm-to-the-touch) in the modified UV-1 was about 35 minutes whereas in the standard UV-1 the sample stage had cooled to only about 125° C. in 35 minutes. At 125° C. the sample stage is too hot to touch with an unprotected hand. The long time that was required to cool the sample stage in the standard UV-1 is due to the large mass of metal in contact with the resistance heater. In the modified UV-1 the sample stage was made of only ⅛" (3.2 mm) thick aluminum plate which was thermally isolated with Teflon™ bushings from the aluminum standoffs or supports used to support it at the four corners.

Another advantage of a radiant heater over a resistance heater is that the radiant heater does not require contact between the sample stage and the radiation source. This is a particular advantage in the UV-1 because it allows one to treat samples of different thicknesses and yet minimize the distance between the UV lamp and the sample surface in order to maximize the photosensitized oxidation rate. In the standard UV-1 the sample support stage is at a fixed distance (1.9 cm) from the UV lamp while in the modified UV-1 the distance between the UV lamp and sample stage can be changed. In the modified UV-1 threaded standoffs or spacers were used to conveniently change the distance between the UV lamp and the sample platform. With this arrangement, samples ranging in thickness from about 0.1 cm to 4.5 cm can be treated (while keeping the distance between the sample surface and UV grid lamp at about 1 mm) without suffering any degradation in platform heating and cooling.

Example B

Since the distance between the UV lamp and the sample stage in the modified UV-1 could be conveniently changed the influence of distance between the lamp and sample on the photoresist strip rate could be studied. For these experiments the distance between the lamp and sample stage was varied from 3 mm to 48 mm.

It is well-known that ozone has a very strong broad UV absorption band centered at 253.7 nm (this is the band most commonly used in UV ozone analyzers). Low pressure mercury UV lamps also emit most strongly at this same wavelength [approximately 80% of all the energy emitted by a mercury lamp appears around 253.7 nm]. Consequently, it is anticipated that in a UV/ozone cleaning system the intensity of the UV radiation from the mercury grid lamp would decrease with distance from the lamp due to absorption by ozone. At constant temperature and constant ozone concentration it may be assumed that the rate of photoresist stripping in the modified UV-1 can be represented by the following rate expression:

Stripping Rate (Angstroms/minute)=constant×$E$     Eq. 1 where E=UV irradiance

Since $E=E_0\exp(-kd)$ (Beer's Law)

where k=the UV extinction coefficient for ozone
d=distance from the UV lamp

Substituting for E, the stripping rate can be represented by the following equations:

Stripping Rate (Angstroms/minute)=$k_1 \times E_0\exp(-kd)$ or     Eq. 2

Logarithm (Stripping Rate)=log $k_2$+log $E_0-kd=k_3-kd$     Eq. 3

Figure 6:
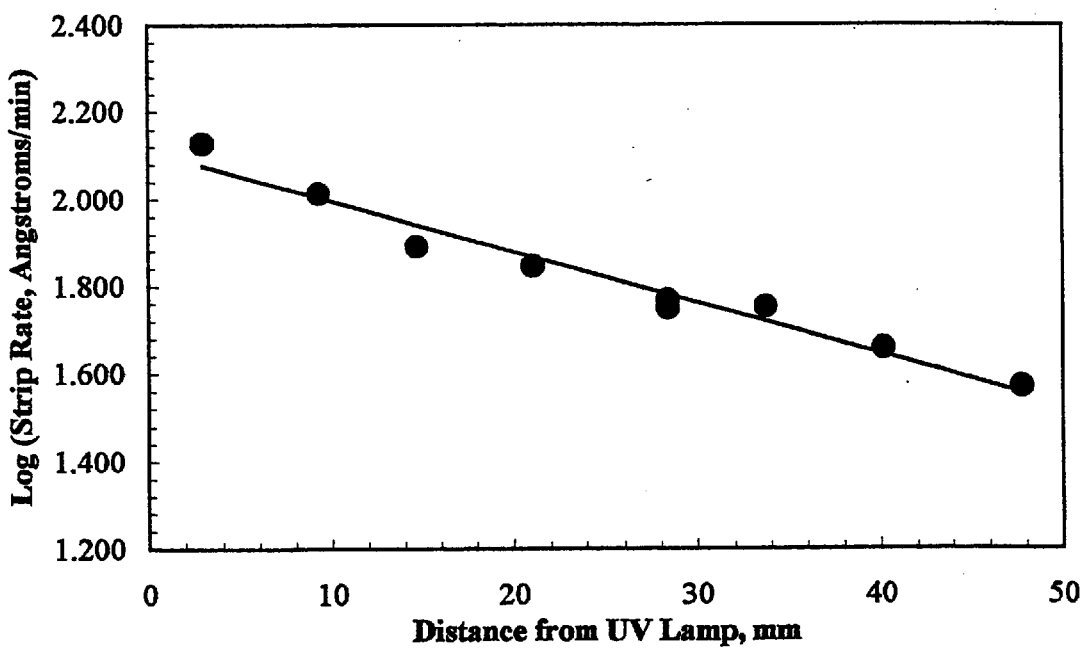
FIG. 6 is a graph showing the influence of the distance from the UV lamp to the sample on the strip rate of the photo resist.

Based on this last equation we would expect that the logarithm of the stripping rate would decrease linearly with distance from the UV grid lamp. To test this equation, stripping rate experiments were done in the modified UV-1 at different distances from the UV grid lamp. The experimental stripping rate was calculated from step-height measurements and time of exposure to UV/ozone. Shown in FIG. 6 is a plot of the logarithm of the stripping rate versus distance from the UV lamp. It is apparent from FIG. 6 that there is good agreement between the experimental stripping rate data and that predicted by Eq. 3.

Example C

Figure 7:
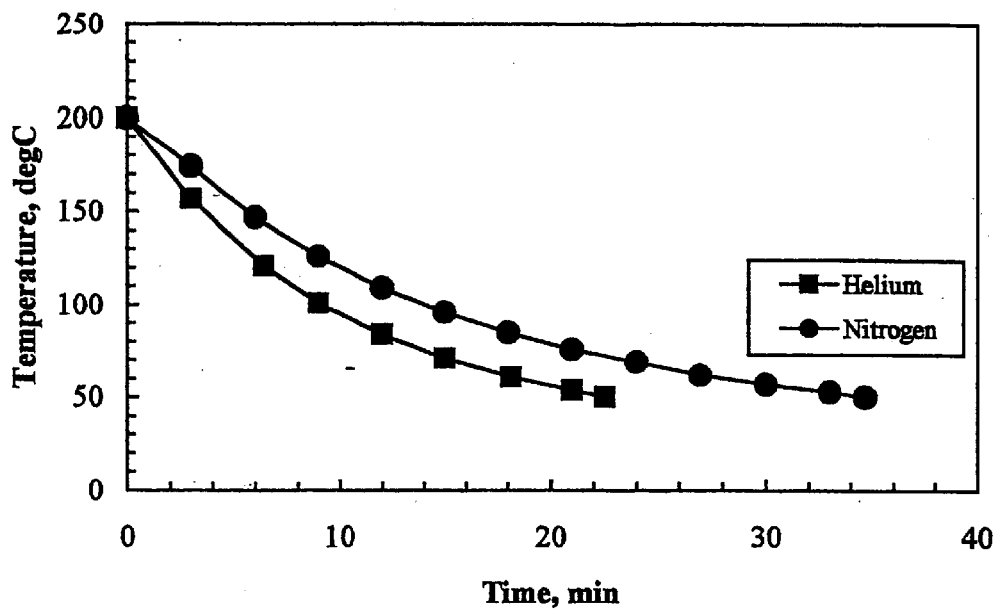
FIG. 7 is a graph illustrating the influence of difference cooling gases on the cooling rate of the sample support stage.

Cooling kinetics for the sample support stage in a modified UV-1 are shown in FIG. 7 for two different cooling gases, nitrogen and helium. Helium was chosen for comparison with nitrogen, the gas generally used for cooling and purging the standard UV-1, because it has a higher thermal conductivity coefficient than nitrogen [376.07×106 at 48.9° C. versus 65.71×106 at 48.9° C. Cal/cm s° C.]. As expected, since the cooling efficiency of helium is superior to nitrogen, the time required to cool the sample stage from 200° C. to 50° C. with helium was about 12 minutes shorter than with nitrogen.

Example D

For most UV/ozone processing applications it is not only desirable to rapidly heat and cool samples but it is also important that the process variables, e.g., temperature, UV irradiance, gas flow rate, and gas composition be uniform throughout the reaction chamber. These variables are important in controlling UV/ozone oxidation reaction kinetics. Table I shows the steady-state temperature of a silicon wafer placed at different locations on the surface of the sample support stage which was heated by quartz infrared heat lamps. For these experiments, the Type K thermocouple junction was bonded to the surface and near the center of a 3" (7.62 cm) diameter silicon wafer. The data in Table I shows that the deviation from the average temperature at the different locations is less than 1 ° C. In other words, the combination of quartz infrared heat lamps and the aluminum support plate provided an environment for uniformly heating samples in the modified UV-1.

TABLE I

Steady state temperature on the surface of a silicon wafer resting at different locations on the sample support stage of a modified UV-1; the bottom of the sample support platform was 4.9 cm from the top of the heat lamps. The set point temperature was 200° C. and the nitrogen flow rate was 2.6 l/min.

| Wafer Location | Temperature, ° C. |
| --- | --- |
| left rear corner | 199.5 |
| right rear corner | 199.1 |
| center | 199.2 |
| left front corner | 197.1 |
| right front corner | 197.5 |
| average | 198.5 ± 0.9 |

Example E

Figure 8:
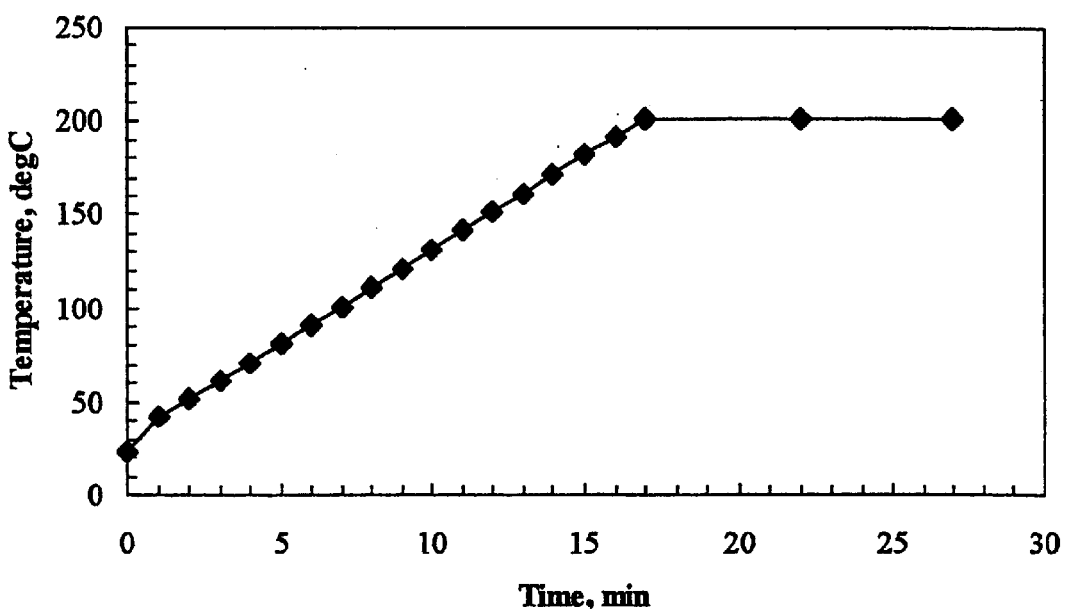
FIG. 8 is a graph showing the temperature rise of a silicon wafer being heated at a control rated rate of 10° C. per minute to a set point of 200° C. using the quartz infrared heat lamps.

For some UV/ozone applications, rapidly heating samples to a setpoint may damage them due to thermal shock. In those cases, ramping or heating at a controlled rate to the setpoint temperature may be necessary. It was found that infrared heat lamps also worked effectively for ramping the temperature to a setpoint. FIG. 8 shows a typical ramping plot for heating a silicon wafer on the sample support stage in the modified UV-1 at a controlled rate of 10° C./min to a setpoint of 200° C. using infrared heat lamps.

Example F

Figure 9:
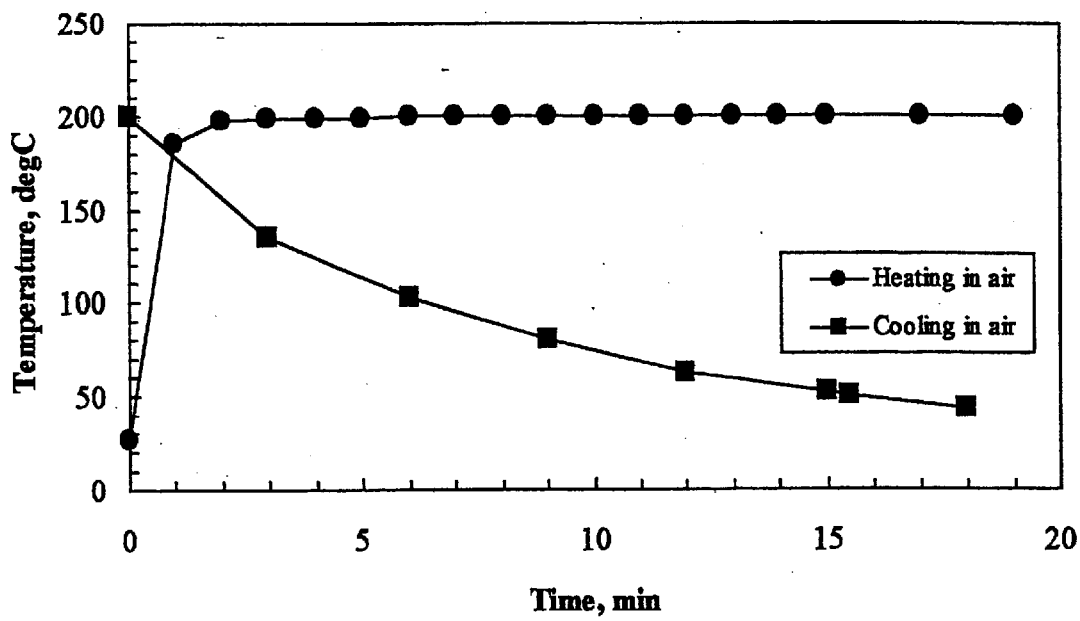
FIG. 9 is a graph showing the heating and cooling curves for a sample stage in air using a metal ribbon radiant heater.

FIG. 9 shows kinetic plots for heating and cooling of the sample support platform by a metal ribbon radiant heater which may be used in place of the radiant heat lamps. This data was gathered with the heater and sample platform in air and not installed in the UV-1. A stream of nitrogen flowed over the surface of the sample platform during this experiment to better simulate the UV-1 reaction chamber. It is apparent when comparing the data in this figure with FIG. 5 that the time required to heat and cool the platform with the metal ribbon radiant heater is again much shorter than with the resistance heater used in the standard UV-1.

Example G

Figure 10:
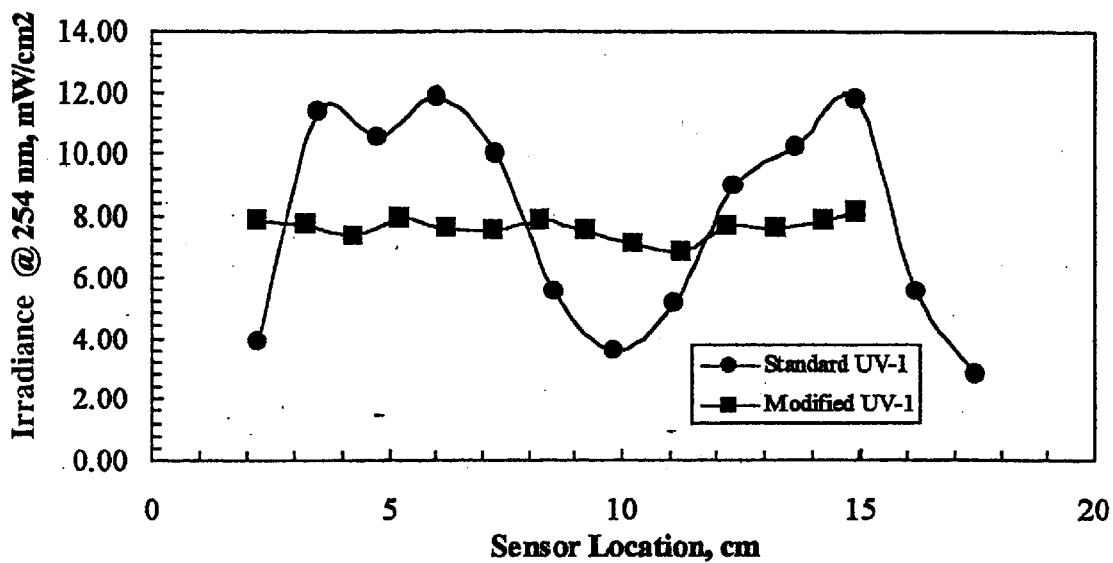
FIG. 10 is a graph comparing the UV irradiance at different locations along a center line of the sample stage using a standard UV hot cathode spiral lamp and a modified UV cold cathode grid lamp in the reaction chamber.

FIG. 10 shows the UV irradiance at different locations along the centerline of the sample support platform in a standard and a modified UV-1. In the standard UV-1 a hot cathode low-pressure mercury lamp in the shape of a spiral is used while in the modified UV-1 a cold cathode low pressure mercury grid lamp was used. FIG. 10 shows that the variation in irradiance at 254 nm and near perpendicular to the plane of the UV lamps is significantly less across the surface of the sample platform when using a grid lamp versus the spiral-shaped lamp. Variations in UV irradiance can result in undesirable differences in oxidation kinetics across the surface of the sample platform.

Example H

Figure 11:
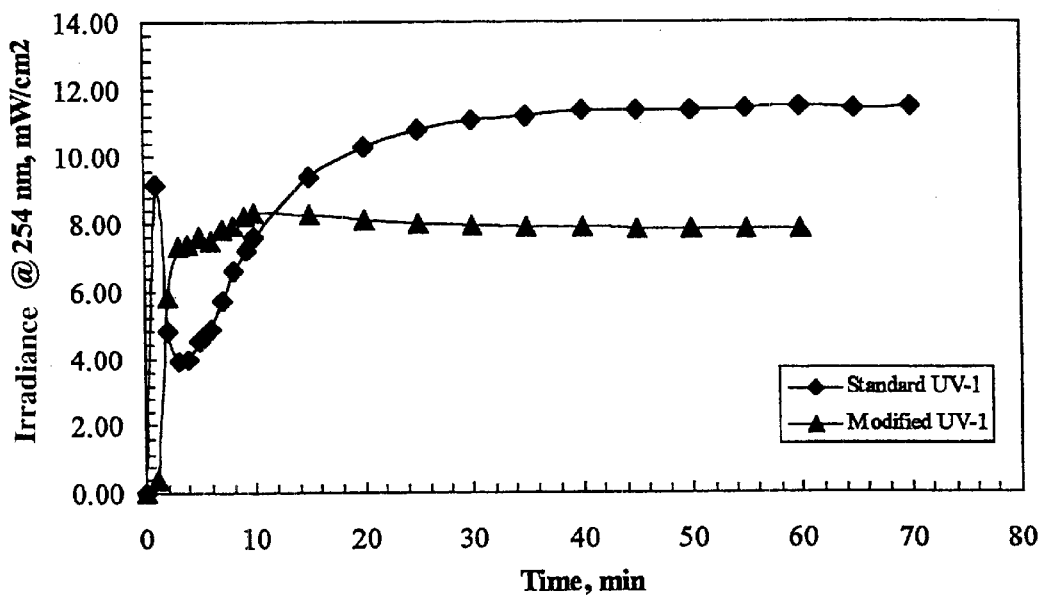
FIG. 11 is a graph comparing the irradiance at 254 nm in a nitrogen atmosphere between a standard UV hot cathode spiral lamp and a modified UV cold cathode grid lamp as a function of time from startup.

FIG. 11 shows the irradiance as a function of time from startup for the standard hot cathode lamp and the grid lamp. This plot shows that it requires approximately 15 to 20 minutes for the hot cathode lamp to reach a near steady-state irradiance output whereas the grid lamp reaches a near steady-state output in about 5 minutes. This difference in UV power output becomes particularly important (again, because UV intensity is an important variable in determining the oxidation rate) for UV/ozone oxidation applications where the treatment time is of short duration, i.e., on the order of a few minutes.

Example I

Figure 12:
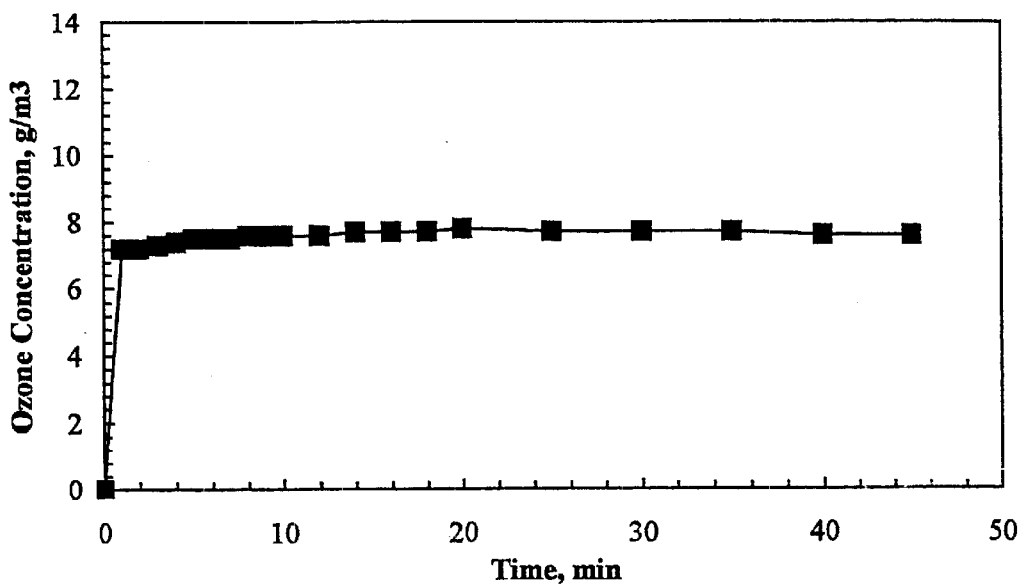
FIG. 12 is a graph of the ozone concentration at the outlet of the ozone generator versus time from startup.

FIG. 12 shows how the ozone concentration at the outlet of the silent discharge generator changes with time after startup. The data in this figure was collected from the generator used in the standard UV-1 and no effort was made in this work to replace it. All of the experiments done in this work which required ozone were done using the standard generator. The primary purpose in showing FIG. 12 is to provide the reader with information regarding the ozone concentration, another important variable in UV/ozone processing, used in this work and how it varied with time. It is apparent from FIG. 12 that the ozone concentration is near steady-state, i.e., ~7.7 g/m$^3$ (0.58 weight percent ozone), after only about 1–2 minutes from startup.

Example J

Table II shows the steady-state UV irradiance at 254 nm in a nitrogen environment at different locations on the sample support stage. It is evident from this data that the UV irradiance using the grid lamp in the modified UV-1 changes very little from one location to another. In other words, the grid lamp uniformly irradiates the sample support stage, unlike the spiral lamp (e.g., see FIG. 11). The deviation from the average irradiance at the different locations is ±0.12 mW/cm$^2$ or ±0.2 percent. The measurements were taken at 50° C. with a nitrogen flow rate of 2.6 l/min and the sensor 5.5 mm from the UV lamp.

TABLE II

Steady-state irradiance at different locations on the surface of the sample support platform in a modified UV-1 with a grid lamp.

| UV Sensor Location | Irradiance @ 254 nm, mW/cm$^2$ |
| --- | --- |
| left rear corner | 7.91 |
| right rear corner | 8.07 |
| center | 7.89 |
| left front corner | 7.97 |
| right front corner | 8.28 |
| average | 8.02 ± 0.12 |

Example K

An issue of concern at the outset of this study was the destruction of ozone by the fluorinated polymeric membrane diffuser. In an effort to determine if the membrane destroyed ozone, a comparison was made between the ozone concentration at the outlet of the ozone generator and the concentration at the outlet of the modified UV-1 reaction chamber. The steady-state concentration at the outlet of the ozone generator was near 7.7 g/m$^3$ as shown in FIG. 12. The measured steady-state concentration at the outlet of the reaction chamber (UV grid lamp off and reaction chamber at ambient temperature) was 7.0 g/m$^3$, a decrease in ozone concentration of 0.7 g/m$^3$. The same pair of measurements was made using a standard UV-1 without a membrane diffuser. In this case, the steady-state difference in concentration between the outlet of the generator and the outlet of the reactor was 1.1 g/m³. These measurements showed that the membrane diffuser did not contribute to ozone decomposition. Other factors, for example, trace organic contaminants or trace ozone decomposition catalysts in the ozone flow path may have been responsible for the loss in ozone between the outlet of the generator and the outlet of the reactor.

Example L

In an effort to determine the flow pattern of the ozone/oxygen mixture through the membrane diffuser in the modified UV-1, moistened sheets of paper impregnated with blue indigo dye were placed on the sample platform and exposed to ozone/oxygen (the UV grid lamp was turned off for these experiments) for short periods of time at ambient temperature. After being exposed to ozone for 75 seconds in the modified UV-1 the color of a test sheet changed from indigo blue to a uniformly bleached white color. These experiments suggested that the flow of the ozone/oxygen mixture through the membrane diffuser was uniform. In the standard UV-1 with the showerhead diffuser, oxidation is known to occur at a faster rate directly beneath the inlet ozone/oxygen gas nozzles of the showerhead and at a slower rate away from the nozzles.

Example M

Table III shows the stripping rate for samples of photoresist on silicon that were placed at different locations on the sample support platform of the modified UV-1. It should be noted from the data in Table III that the stripping rate for the samples at the two rear corners of the platform is lower than at the other three locations. It is believed that these lower rates are related to the ozone flow rate or residence time at the two rear corners. As mentioned previously, in order to provide clearance for the grid lamp electrode leads it was necessary to machine a strip of metal from the two rear corners of the sample platform. These cutouts may have influenced the ozone/oxygen flow in this area thus resulting in a lower strip rate. A faster flow rate or shorter residence time may account for the observed low oxidation rate. The indigo dye experiments did not reveal any non-uniform gas flow over the substrate support platform. The discrepancy between the stripping experiments and the dye experiments may be explained on the basis of the greater amount of ozone in the inlet stream than was necessary to completely react with the amount of dye in the test sheets in a period of 75 seconds. In other words, within only 75 seconds, all of the dye in the test sheets reacted with ozone, even in regions where the ozone residence time may have been shorter than the average time. For this experiment, samples were pre-dried for 15 minutes at 200° C. in nitrogen before being stripped, ozone/oxygen flow rate was 0.5 l/min and the sample surfaces were ~9 mm from the UV grid lamp.

TABLE III

Photoresist strip rate at different locations on the sample support platform of a modified UV-1 with quartz infrared heat lamps, a UV grid lamp and a membrane diffuser.

| Si Chip Location | Strip Rate, Angstroms-min$^{-1}$ |
| --- | --- |
| left rear corner | 68 |
| right rear corner | 67 |
| center | 90 |
| left front corner | 94 |
| right front corner | 90 |

A small number of photoresist stripping experiments were done in the standard UV-1 to compare the rates with those obtained using the modified UV-1. In the standard UV-1 the stripping rate was 119 Angstroms per minute with an average deviation of ±4 Angstroms per minute. In comparing this value with those given in Table III it is apparent that the rate in the standard unit at one location was higher than at any of the locations in the modified UV-1. This difference can be attributed to the higher UV irradiance in the standard UV-1. The irradiance in the location where the photoresist samples were placed in the standard UV-1 was 13.09 mW/cm² whereas in the modified UV-1 the average irradiance was only 8.02 mW/cm². It should be noted that a 30 mA grid lamp was used in this work, however, there are commercially available grid lamps with slightly larger electrodes that operate at 60 mA. At 60 mA the UV irradiance is reported (Jelight Company, Inc.) to be 20–30 percent higher than with the 30 mA lamp. No attempt was made to cool either of the two UV lamps in this work.

Example N

Since a fluorinated polymer membrane diffuser was used in this work it was of interest to determine if the membrane degraded in the presence of UV and ozone and whether or not fluorinated degradation products would appear on the surface of samples being processed. To study this possibility, photoresist samples were partially stripped from the surface of a silicon wafer and the photoresist surface was then analyzed by XPS. No fluorine was detected on the surface of the partially stripped photoresist. In another series of experiments, a section of a polished silicon wafer (a hydrogen-free surface) was treated with UV/ozone and then analyzed by XPS. As in the case of the partially stripped photoresist experiments, no fluorine was detected by XPS on the surface of the UV/ozone treated silicon. The detection limit for fluorine by XPS is equal to or less than 0.1 atomic percent. There was no visual damage to the membrane nor was there any apparent change in the flow characteristics of the membrane.

The modifications made to a commercial UV/ozone oxidation processor improved the process time and uniformity of stripping or cleaning of the UV/ozone oxidation system. Radiant heaters were used as a replacement for a resistance heater. Quartz infrared heat lamps or a metal ribbon radiant heater dramatically shortened the heating-cooling cycle relative to a resistance heater; the lamps also heated the sample platform uniformly. Also, with the radiant heaters, samples of different thicknesses could easily be processed. The cold cathode UV grid lamp provided more uniform illumination of the sample support platform than did the standard hot cathode spiral lamp. Additionally, the grid lamp reached steady-state power output sooner than the spiral lamp. A fluorinated polymeric membrane was found to be an effective diffuser for ozone/oxygen mixtures and there was no apparent degradation of the membrane due to exposure to UV/ozone.

While the invention has been described in detail with reference to the preferred embodiments thereof, it will be apparent to one skilled in the art that various changes and modifications can be made and equivalents employed, without departing from the present invention.

What is claimed is:

1. An ultraviolet-ozone oxidation system comprising:
   a reaction chamber;
   an ozone source;
   a sample stage for supporting a sample in the reaction chamber;
   a source of ultraviolet light directed at the sample on the sample stage; and a membrane diffuser positioned between the ozone source and the sample stage for uniformly distributing ozone to the sample on the sample stage.

2. The oxidation system of claim 1, wherein the membrane diffuser is formed of a porous material having pore sizes of about $0.1\mu$–$1\mu$.

3. The oxidation system of claim 1, wherein the membrane diffuser is formed of a material which does not degrade when exposed to ozone and ultraviolet light.

4. The oxidation system of claim 1, wherein the membrane diffuser is formed of a material from the group consisting of glass, polymer, and ceramic.

5. The oxidation system of claim 1, wherein the ozone source delivers ozone to the reaction chamber through a manifold having a central outlet which is substantially centered above the membrane diffuser.

6. The oxidation system of claim 5, further comprising an ozone baffle positioned at the central outlet for distributing the ozone from the ozone source over the membrane diffuser.

7. The oxidation system of claim 1, wherein the membrane diffuser also acts as a filter to filter out particulate contaminates.

8. The oxidation system of claim 1, wherein the ozone source is an external ozone source for delivering ozone to the reaction chamber.

9. The oxidation system of claim 1, wherein the ozone source is provided by ozone generated within the reaction chamber by exposure of oxygen to ultraviolet light.

10. The oxidation system of claim 1, wherein the membrane diffuser is gas permeable.

11. An ultraviolet-ozone oxidation system comprising:

a reaction chamber;

a source of reaction gas;

a sample stage for supporting a sample in the reaction chamber;

a membrane diffuser positioned between the source of reaction gas and the sample stage; and an ultraviolet light source positioned between the membrane diffuser and the o sample stage.

12. The oxidation system of claim 11, wherein the membrane diffuser distributes reaction gas uniformly over the surface of the ultravioet light source.

13. The oxidation system of claim 11, wherein the ultraviolet light source is a grid lamp.

14. The oxidation system of claim 11, wherein ozone is generated by exposure of the reaction gas to the ultraviolet light.

15. The oxidation system of claim 11, wherein the reaction gas source includes an external ozone generator.

16. The oxidation system of claim 11, wherein the membrane diffuser and ultraviolet light are attached to opposite surfaces of a mesh.

17. The oxidation system of claim 11, wherein the mesh has a thickness of about 0.16 cm.

* * * * *